United States Patent
Li et al.

(10) Patent No.: US 8,134,689 B2
(45) Date of Patent: Mar. 13, 2012

(54) DUAL STAGE POSITIONING AND SWITCHING SYSTEM

(75) Inventors: Xiaoping Li, Shanghai (CN); Yingsheng Li, Shanghai (CN)

(73) Assignee: Shanghai Micro Electronics Equipment Co., Ltd., Shanghai (CN)

( * ) Notice: Subject to any disclaimer, the term of this patent is extended or adjusted under 35 U.S.C. 154(b) by 365 days.

(21) Appl. No.: 12/444,631

(22) PCT Filed: Dec. 4, 2006

(86) PCT No.: PCT/CN2006/003270
§ 371 (c)(1),
(2), (4) Date: Apr. 7, 2009

(87) PCT Pub. No.: WO2008/037131
PCT Pub. Date: Apr. 3, 2008

(65) Prior Publication Data
US 2010/0045961 A1    Feb. 25, 2010

(30) Foreign Application Priority Data

Sep. 22, 2006   (CN) .......................... 2006 1 0116453

(51) Int. Cl.
G03B 27/58   (2006.01)
G03B 27/60   (2006.01)
(52) U.S. Cl. .......................................... 355/72; 355/73
(58) Field of Classification Search .................... 355/73, 355/72; 310/12.06
See application file for complete search history.

(56) References Cited

U.S. PATENT DOCUMENTS

| | | | |
|---|---|---|---|
| 6,318,538 B1 | 11/2001 | Shibuya | |
| 6,498,350 B2 * | 12/2002 | Kwan et al. | 250/442.11 |
| 6,740,891 B2 * | 5/2004 | Driessen et al. | 250/492.1 |
| 2006/0023186 A1 | 2/2006 | Binnard | |

FOREIGN PATENT DOCUMENTS

| | | |
|---|---|---|
| CN | 1487365 | 4/2004 |
| CN | 1828427 A | 9/2006 |
| EP | 1 111 471 A2 | 6/2001 |
| JP | 2004259966 | 9/2004 |
| JP | 2005038874 | 2/2005 |

* cited by examiner

*Primary Examiner* — Hung Henry Nguyen
*Assistant Examiner* — Michelle Iacoletti
(74) *Attorney, Agent, or Firm* — Rabin & Berdo, PC (57) ABSTRACT

The present invention has disclosed a dual stage positioning and switching system, which comprises at least a base, a first object stage positioning unit disposed on the base for a first workstation, and a second object stage positioning unit for a second workstation. Each of the object stage positioning units comprises at least a supporting structure, an X-direction guide bar, a Y-direction guide bar, and a motion positioning detector, wherein, the supporting structure comprises an object stage, and an object stage connector moving relative to the object stage. The object stage positioning unit further comprises a driver connecting to the object stage connector and driving the connector to move along the X-direction guide bar. The X-direction guide bars are positioned on and movable along the Y-direction guide bars. The system further comprises an object stage connector for transitional use during the switching process, which is positioned at the center of the Y-direction guide bar located on one side of the base. The present system does not include a cable stage, so that the structure of the system is simplified.

15 Claims, 6 Drawing Sheets

DUAL STAGE POSITIONING AND SWITCHING SYSTEM

TECHNICAL FIELD

The present invention relates to the field of motion positioning techniques, particularly to a dual stage positioning and switching system.

BACKGROUND ART

A dual stage positioning and switching system is used for the switch of two wafer stages. The wafer stages cooperate with the base, X-direction guide bars, Y-direction guide bars, motion positioning detectors, linear gratings, etc. to complete the switching process. The above system can be used in the field of lithography machine manufacturing.

A lithography machine, which exposes and transfers the design pattern of a chip onto the photoresist coated on a wafer, is one of the important devices used in IC chip manufacturing. A main part of a lithography machine is the wafer stage positioning and switching system, whose operation accuracy and running speed greatly influences the throughput of a lithography machine.

A complete exposure process comprises such sub-processes as wafer loading, pre-alignment, alignment, level adjustment detection, exposure, wafer unloading, etc. In a dual stage structure, the wafer stage of the pre-processing workstation carries out wafer loading/unloading, pre-alignment, alignment, level adjustment detection and other pre-processing steps, while the wafer stage of the exposure workstation carries out the exposure steps. The two workstations operate simultaneously to shorten the cycle of the exposure process of a wafer, and thereby improving the throughput of the lithography machine.

Figure 1:
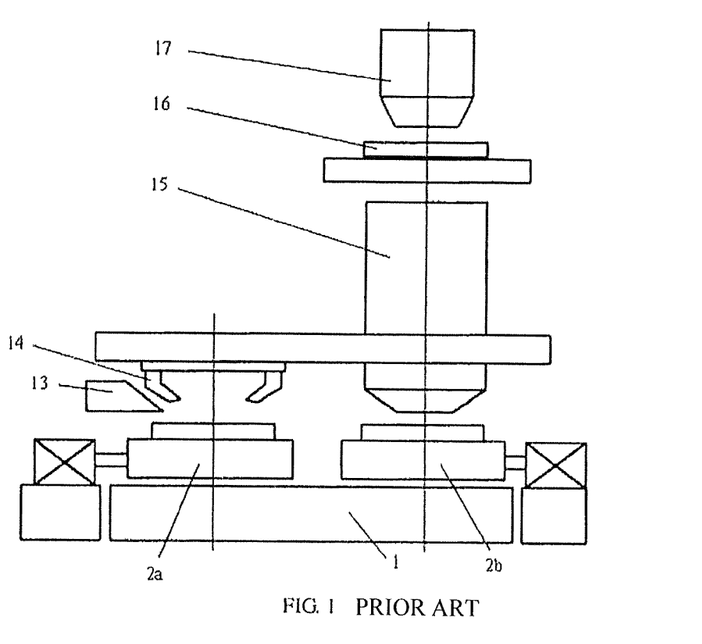
FIG. 1 is a schematic view of a lithography machine having dual wafer stage structure.

Referring to FIG. 1, a lithography machine adopting dual stage structure comprises from the top down an illumination system 17, a reticle stage positioning system 16, a projection object lens system 15, a focus and level adjustment detecting system 14, an alignment system 13, a first wafer stage positioning unit 2a for the pre-processing workstation, a second wafer stage positioning unit 2b for the exposure workstation, and a base 1.

Present dual stage structures can achieve the positioning and switching of two wafer stages, but there remain some disadvantages of the present structures: since a wafer stage has a lot of cables connected thereto, such as the gas supplying pipelines, the control lines for adjusting the vertical (Z-direction) positions of the wafer stages, cables of the sensors for detecting the X and Y direction positions of the wafer stages and other sensor circuits, cables of the circuit that controls the loading and unloading of the wafer, etc. A cable stage is needed to collect all the above cables, and it must be controlled to move synchronously with the wafer stage. The operation of the cable stage directly influences the motion positioning accuracy and the dynamic performance of the wafer stage, thus increasing the cost of the dual stage structure as well as the difficulty in the positioning and switching of the two stages. Moreover, during the synchronous operations of the two stages, due to the overlapped work space, the stages are likely to interfere with each other, and the paths of the stages may also overlap. Therefore, devices for preventing collision between the stages are needed, so that the manufacturing cost is raised.

SUMMARY OF INVENTION

It is an object of the present invention to provide a dual stage positioning and switching system, which does not need to include a cable stage moving synchronously with the wafer stage, so that the structure is simplified.

In order to achieve the aforementioned object, the present invention is set forth as follows: the system comprises at least a base, a first object stage positioning unit disposed on the base for a first workstation, and a second object stage positioning unit for a second workstation; each of the object stage positioning units comprising at least a supporting structure, an X-direction guide bar, a Y-direction guide bar, and a motion positioning detector. The supporting structure comprises an object stage connector, and an object stage moving relative to the object stage connector. The object stage positioning unit further comprises a driver connecting to the object stage connector and driving the connector to move along the X-direction guide bar. The X-direction guide bars are positioned on and movable along the Y-direction guide bars. The system further comprises an object stage connector for transitional use during the switching process, which is positioned at the center of the Y-direction guide bar located in the front of the base.

If the present invention is applied to lithography machine manufacturing, the first workstation will be a pre-processing workstation, and the second workstation will be an exposure workstation. The object stage positioning unit is a wafer stage positioning unit. The supporting structure is a wafer supporting structure. The object stage is a wafer stage, and the object stage connector is a wafer stage connector.

The supporting structures are connected to the base via gas levitation or magnetic levitation to reduce the friction between the structures and the X, Y-direction guide bars during movement. The supporting structure further comprises a linear motor, a gas levitation bearing, a pair of circuit contacts respectively belonging to the object stage and the object stage connector, a fastener, and a vacuum pipeline unit, wherein, the linear motor, including a permanent magnet and a winding, is used for driving the supporting structure during dual stage switching; the fastener is used to fix the object stage with the object stage connector of the supporting structure; the circuit contacts are used to connect the object stage with the object stage connector; the vacuum pipeline unit, including a vacuum pipeline and an energy storage device, is used to create a temporary vacuum environment during the switching process. The object stage is supported by the object stage connector via gas levitation bearings. The gas levitation bearings can be vacuum preload gas levitation bearings or permanent magnetic preload gas levitation bearings, which are used to reduce the friction during the switching movements of the object stages.

The motion positioning detector is a laser interferometer, used for level adjustment detection and alignment at the pre-processing workstation and for exposure position measurement and positioning at the exposure workstation. A linear grating is disposed on at least one of the X-direction guide bars and at least one of the Y-direction guide bars. The linear gratings cooperate with the motion positioning detectors to measure and feedback the position information of the wafer supporting structures.

Compared with the known art, the present invention has the advantage that the two workstations of the dual stage structure do not overlap, eliminating the interference between the two stages, and thereby improving the reliability of the system.

Besides, there is no cable stage included in the present system, so that the structure of the system is simplified, and the influence on the positioning accuracy of the system caused by distorted cables is effectively reduced.

BRIEF DESCRIPTION OF DRAWINGS

FIG. 10 is a top plan view of the wafer stage 20b moved to the wafer stage connector 21a.

DETAILED DESCRIPTION OF PREFERRED EMBODIMENT

The present invention will be described in detail by reference to the drawings and the preferred embodiment. The preferred embodiment is a dual stage positioning and switching system used in the field of lithography machine manufacturing.

Figure 2:
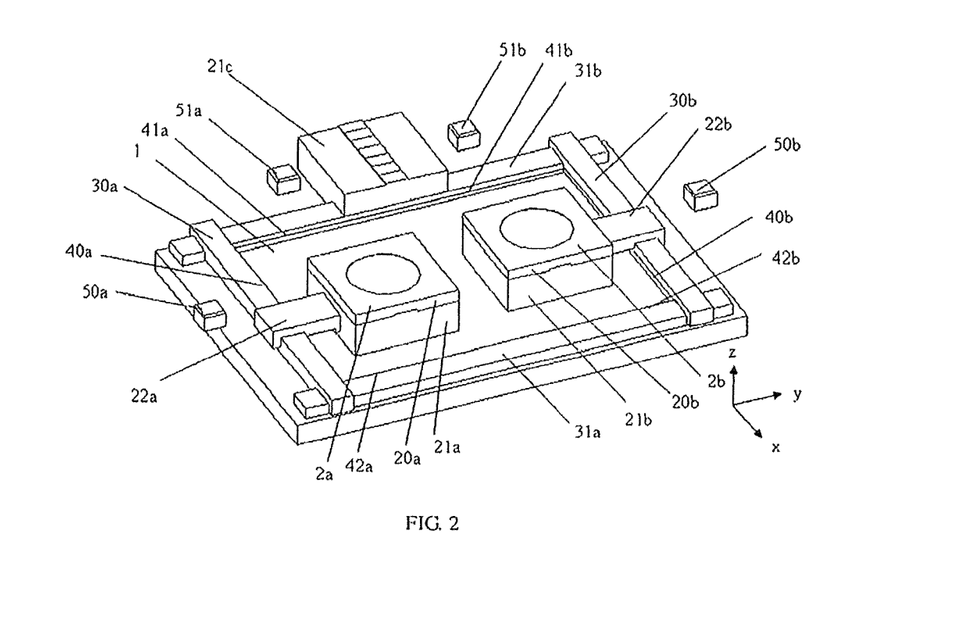
FIG. 2 is a layout of the structure of the dual stage positioning system of the present invention.

FIG. 2 shows a layout of the dual stage positioning system of the present invention. The system comprises a base 1, a first wafer stage positioning unit disposed on the base 1 for a pre-processing workstation, and a second wafer stage positioning unit disposed on the base 1 for an exposure workstation. The first wafer stage positioning unit for the pre-processing workstation comprises a wafer supporting structure 2a, a driver 22a, motion positioning detectors 50a, 51a, an X-direction guide bar 30a, Y-direction guide bars 31a, 31b, and linear gratings 40a, 41a, 42a disposed respectively on the guide bars. The second wafer stage positioning unit for the exposure workstation comprises a wafer supporting structure 2b, a driver 22b, motion positioning detectors 50b, 51b, an X-direction guide bar 30b, Y-direction guide bars 31a, 31b, and linear gratings 40b, 41b, 42b disposed respectively on the guide bars. Wherein, Y-direction guide bars 31a and 31b belong to both of the workstations.

Motion positioning detectors 50a, 51a, 50b, 51b are used for real-time detection and control of the alignment, level adjustment detection at the pre-processing workstation and the exposure position determination at the exposure workstation. The motion positioning detectors are laser interferometers. Linear gratings 40a, 41a, 42a, 40b, 41b, 42b are used as position feedback devices of the X-direction guide bars, the Y-direction guide bars and the wafer supporting structures. The linear gratings cooperate with the laser interferometers to control the process of dual stage switching.

Each of the X-direction guide bars 30a, 30b and Y-direction guide bars 31a, 31b has a long-distance linear motor installed therein (not shown in the figure). X-direction guide bars are positioned on Y-direction guide bars, and can move along Y-direction guide bars driven by the linear motors.

Wafer supporting structures 2a, 2b are connected to the base 1 via gas levitation or magnetic levitation. The apparatus 2a, 2b are driven by the linear motors to move in the X or Y direction without friction. The wafer supporting structure 2a comprises a wafer stage 20a and a wafer stage connector 21a. The wafer supporting structure 2b comprises a wafer stage 20b and a wafer stage connector 21b. The wafer stages and the wafer stage connectors can move relative to each other. A third wafer stage connector 21c is positioned at the center of the Y-direction guide bar 31b, for transitional use during the switching process.

Figure 3:
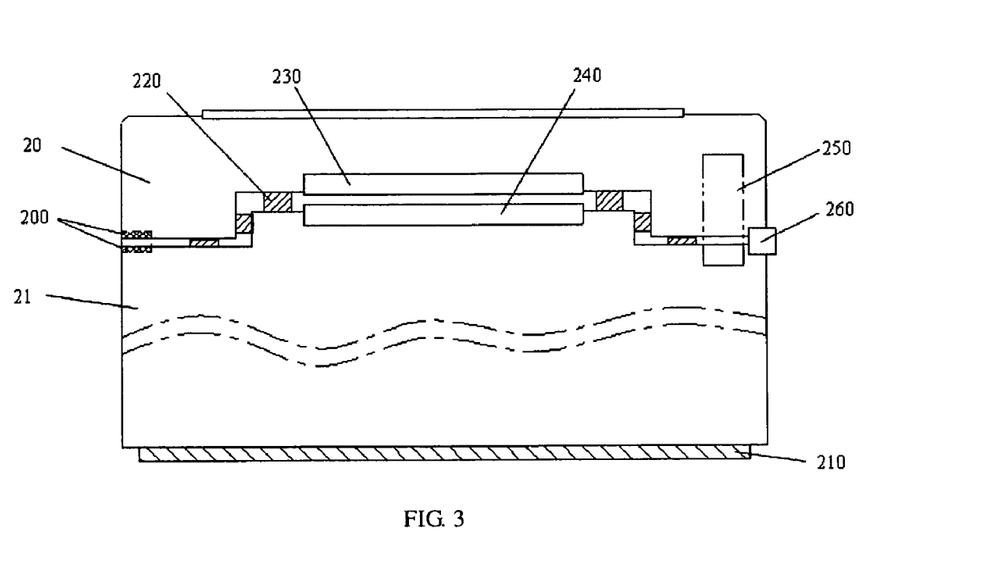
FIG. 3 is a schematic view of the wafer supporting structure.

FIG. 3 is a schematic view of the wafer supporting structure of the present invention. The wafer supporting structure comprises a wafer stage 20, and a wafer stage connector 21 supporting the wafer stage 20. The stage 20 and the connector 21 are connected and driven by the following structure comprising: a permanent magnet 230 of the linear motor, a winding 240 of the linear motor, a gas levitation bearing 220, a pair of circuit contacts 200, a fastener 260, and a vacuum pipeline unit 250. Wherein, the vacuum pipeline unit 250 is composed of a vacuum pipeline and an energy storage device. The unit 250 keeps the wafer stage 20 under a temporary vacuum status under the control of the vacuum pipeline controller set inside the wafer stage connector 21, so that the wafer will be kept absorbed to the wafer stage when the two stages are switching.

During the switching process, the wafer stage 20 is supported by the gas levitation bearing 220, and is driven by the linear motor to perform frictionless movements. The gas levitation bearing 220 can be a vacuum preload gas levitation bearing or a permanent magnetic preload gas bearing. After the switching process, a fastener 260 is used to fix the wafer stage 20 to the wafer stage connector 21. The circuit contacts 200 separate with each other during the switching process, and connect to each other under other circumstances.

FIGS. 4-11 show the switching process of the two wafer stages of the present invention.

Figure 4:
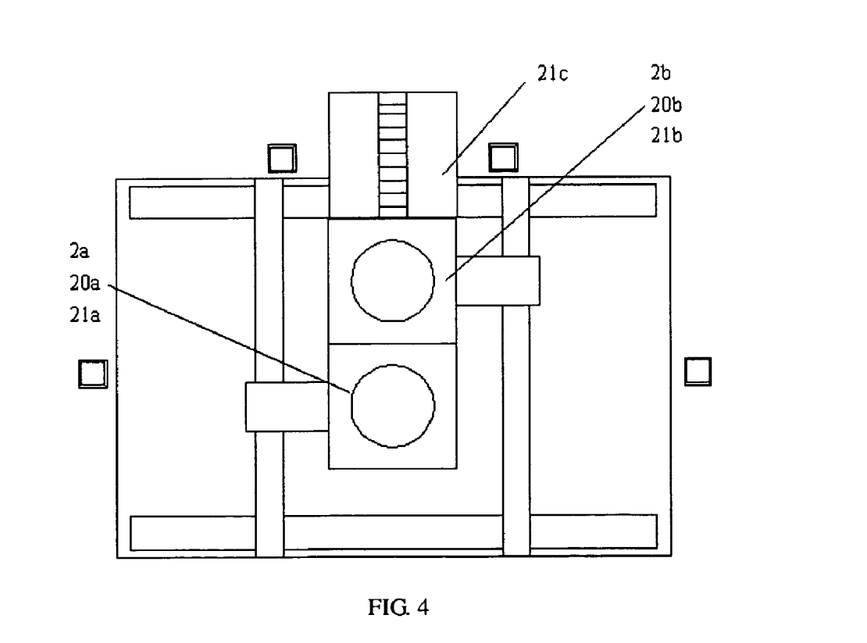
FIG. 4 is a top plan view of the two wafer stages at the switching position.

FIG. 4 is a top plan view of the two wafer stages at the switching position. The wafer supporting structure 2b of the exposure workstation is connected to the transitional wafer stage connector 21c, and is also connected to the wafer supporting structure 2a of the pre-processing workstation. These three components are all located on the central axis of the base.

Figure 5:
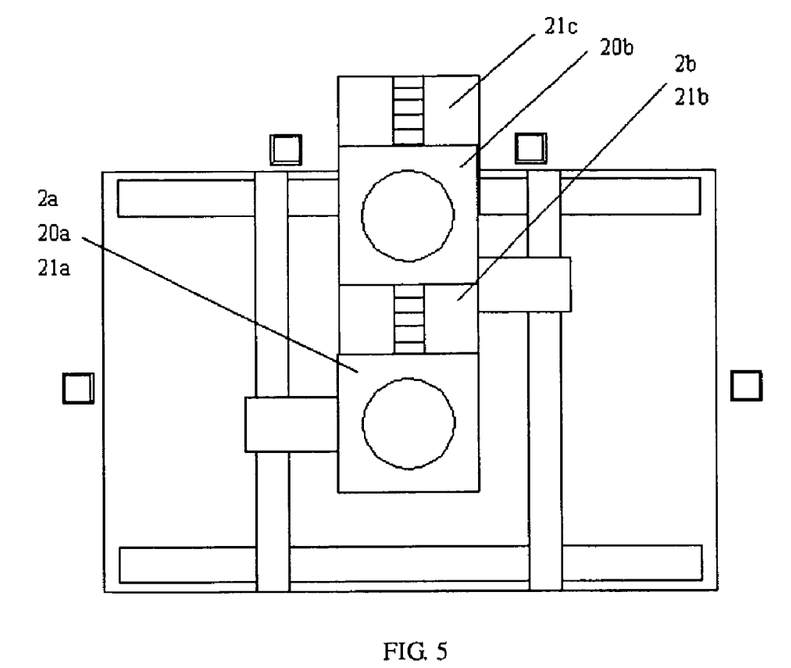
FIG. 5 is a top plan view of the wafer stage 20b moving to the wafer stage connector 21c.

FIG. 5 is a top plan view of the wafer stage 20b moving to the wafer stage connector 21c. In the wafer supporting structure 2b of the exposure workstation, the pair of circuit contacts 200 separate with each other, so that the wafer stage 20b can move from the wafer stage connector 21b to the transitional wafer stage connector 21c under the drive of the linear motor. During the above process, the wafer is kept absorbed to the wafer stage under the vacuum environment provided by the vacuum pipeline of the wafer stage.

Figure 6:
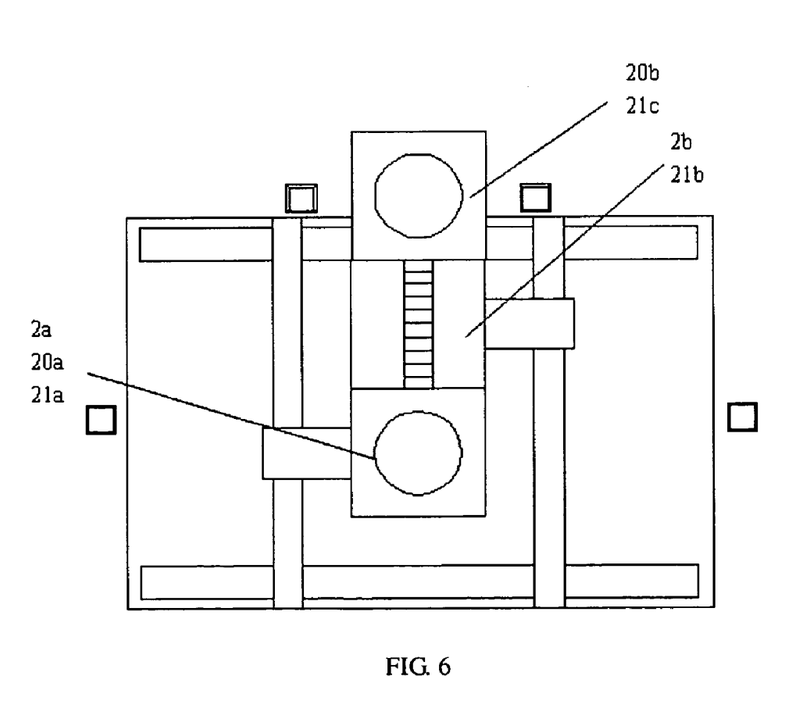
FIG. 6 is a top plan view of the wafer stage 20b moved to the wafer stage connector 21c.

FIG. 6 is a top plan view of the wafer stage 20b moved to the wafer stage connector 21c. At this time, the wafer stage connector 21b of the exposure workstation is ready to receive the wafer stage 20a of the pre-processing workstation.

Figure 7:
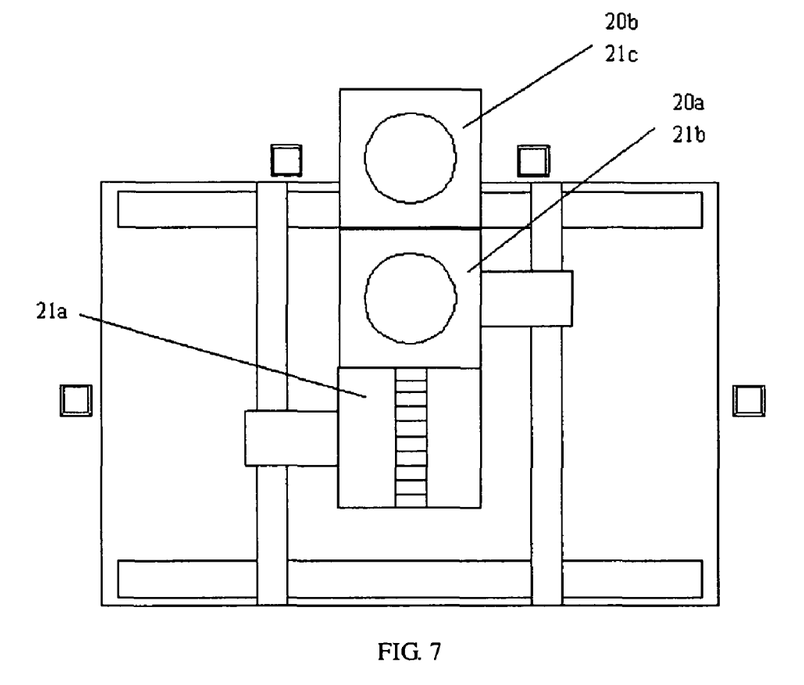
FIG. 7 is a top plan view of the wafer stage 20a moved to the wafer stage connector 21b.

FIG. 7 is a top plan view of the wafer stage 20a moved to the wafer stage connector 21b. At this time, the process of switching the wafer from the pre-processing workstation to the exposure workstation is finished.

Figure 8:
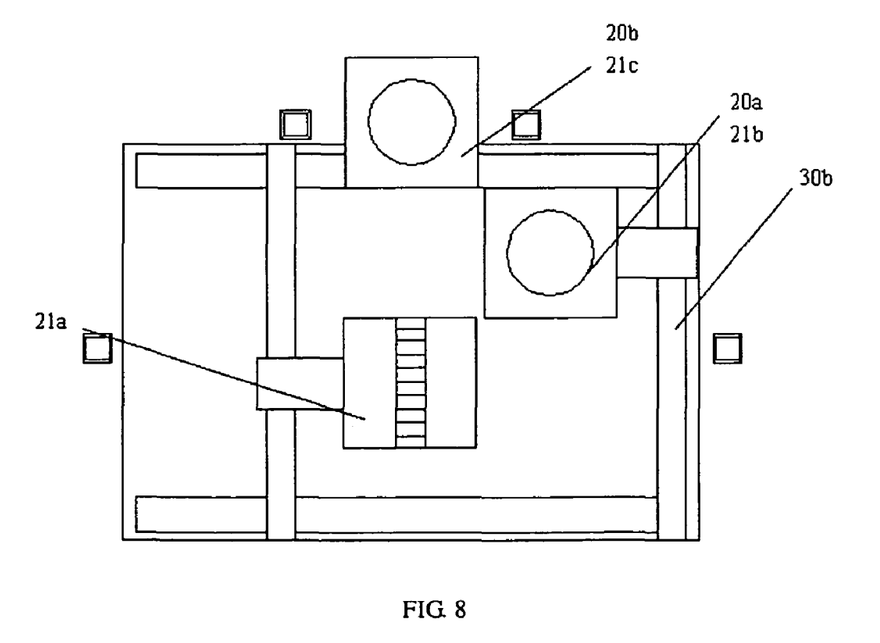
FIG. 8 is a top plan view of the wafer stage 20a and the wafer stage connector 21b at the exposure position.

FIG. 8 is a top plan view of the wafer stage 20a and the wafer stage connector 21b at the exposure position. The wafer stage positioning unit at the exposure workstation, i.e. the wafer stage 20a and the wafer stage connector 21b, is moved to the right portion of the Y-direction guide bar (the exposure workstation) with the X-direction guide bar 30b. A series of predetermined exposure steps can be carried out without interfering with the wafer stage connector 21a at the pre-processing workstation. The wafer stage connector 21a is ready to move in the X-direction to the transitional wafer stage connector 21c and connect with the connector 21c, in order to receive the wafer stage 20b presently supported by the wafer stage connector 21c.

Figure 9:
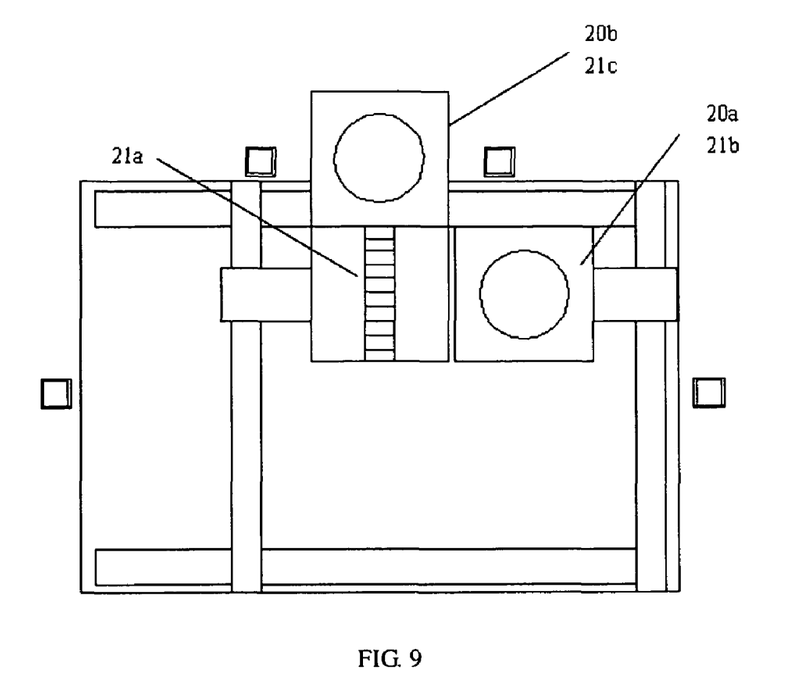
FIG. 9 is a top plan view of the wafer stage connector 21a connected to the wafer stage connector 21c.

FIG. 9 is a top plan view of the wafer stage connector 21a connected to the wafer stage connector 21c. The wafer stage connector 21a moves to and connects to the wafer stage connector 21c, ready to receive the wafer stage 20b, which has finished the exposure process and is presently supported by the connector 21c.

Figure 10:
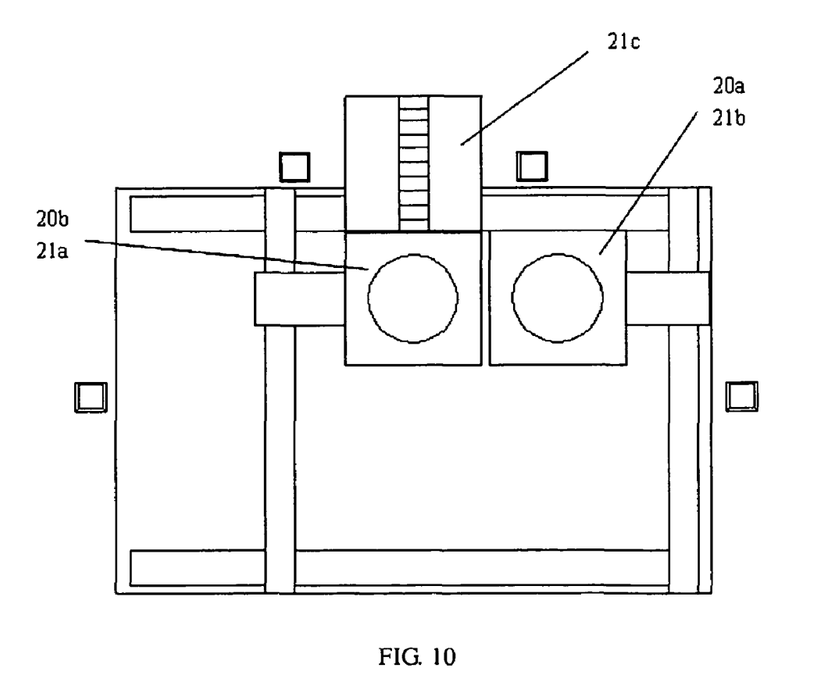

FIG. 10 is a top plan view of the wafer stage 20b moved to the wafer stage connector 21a. The wafer stage 20b originally supported by the transitional wafer stage connector 21c is driven by the linear motor to move to the wafer stage connector 21a of the pre-processing workstation. At this time, the process of switching the wafer from the exposure workstation to the pre-processing workstation is finished.

Figure 11:
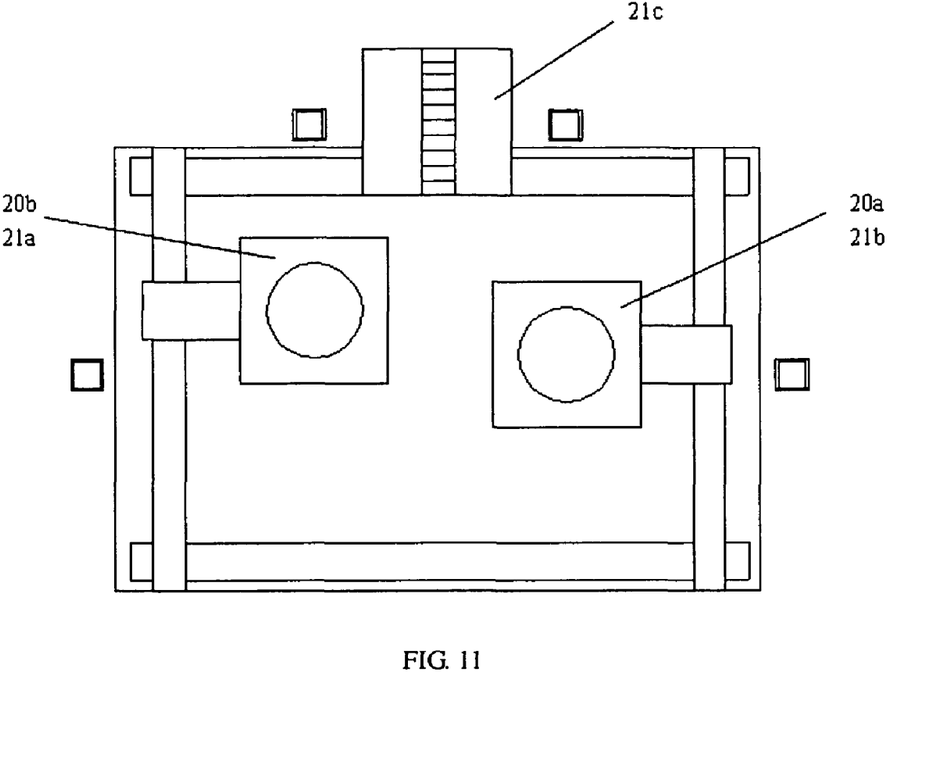
FIG. 11 is a top plan view of the wafer stage 20b and the wafer stage connector 21a at the pre-processing position.

FIG. 11 is a top plan view of the wafer stage 20b and the wafer stage connector 21a at the pre-processing position. The wafer stage positioning unit at the pre-processing workstation, i.e. the wafer stage 20b and the wafer stage connector 21a, is moved to the left portion of the Y-direction guide bar (the pre-processing workstation) with the X-direction guide bar 30a, so that a series of pre-processing steps such as wafer loading/unloading, pre-alignment, alignment, level adjustment detection can be carried out at the pre-processing workstation.

When the wafers of the two workstations respectively finishes the pre-processing steps and the exposure steps, the two wafer stage positioning units move to the switching position (see FIG. 4) and repeat the cycle of dual stage switching as shown in FIGS. 4-11, thereby continuously and completely carrying out the wafer exposure processes.

The foregoing description has disclosed some embodiments of the present invention. But the present invention should not be restricted to the field of motion positioning of the semiconductor lithography process. The present invention can be used in any apparatus or system involving precise positioning techniques and requiring the exchange and simultaneous operation of two stages. Although the preferred embodiments of the present invention are disclosed as above, technicians of this field should aware that any modification, interpolation or variation within the principle of the present invention falls in the scope of the present invention.

What is claimed is:

1. A dual stage positioning and switching system, comprising:
    a base;
    two object stage positioning units, disposed on said base and including a first object stage positioning unit for a first workstation and a second object stage positioning unit for a second workstation; and
    a transitional object stage connector for transitional use during a switching process,
    each of the two object stage positioning units comprising:
        at least a supporting structure including an object stage and an object stage connector, said object stage being movable relative to said object stage connector,
        an X-direction guide bar,
        a Y-direction guide bar,
        a motion positioning detector, and
        a driver connecting to said object stage connector and driving said object stage connector to move along said X-direction guide bar,
        said X-direction guide bar being positioned on and movable along said Y-direction guide bar, wherein
    the transitional object stage connector is fixed at the center of said Y-direction guide bar located on one side of said base, and
    the transitional object stage connector is configured to receive the object stage of one of the two object stage positioning units and then transfer, after the object stage of the other of the two object stage positioning units is transferred to the object stage connector of the one of the two object stage positioning units, the object stage of the one of the two object stage positioning units to the object stage connector of the other of the two object stage positioning units.

2. The dual stage positioning and switching system as claimed in claim 1, characterized in that said first workstation is a pre-processing workstation, and said second workstation is an exposure workstation.

3. The dual stage positioning and switching system as claimed in claim 1, characterized in that said object stage positioning unit is a wafer stage positioning unit.

4. The dual stage positioning and switching system as claimed in claim 1, characterized in that said supporting structure is a wafer supporting structure.

5. The dual stage positioning and switching system as claimed in claim 1, characterized in that said object stage is a wafer stage; said object stage connector is a wafer stage connector.

6. The dual stage positioning and switching system as claimed in claim 4, characterized in that said supporting structure connects to said base via gas levitation or magnetic levitation.

7. The dual stage positioning and switching system as claimed in claim 4, characterized in that said supporting structure further comprises a linear motor, a gas levitation bearing, a pair of circuit contacts, a fastener, and a vacuum pipeline unit; said object stage being connected to said object stage connector via said gas levitation bearing, said circuit contacts, and said fastener.

8. The dual stage positioning and switching system as claimed in claim 7, characterized in that said vacuum pipeline unit comprises a vacuum pipeline and an energy storage device.

9. The dual stage positioning and switching system as claimed in claim 7, characterized in that said gas levitation bearing is selected from the group consisting of vacuum preload gas levitation bearing and permanent magnetic preload gas levitation bearing.

10. The dual stage positioning and switching system as claimed in claim 1, characterized in that said motion positioning detector is a laser interferometer.

11. The dual stage positioning and switching system as claimed in claim 1, characterized in that a linear grating is positioned on at least one of said X-direction guide bars and at least one of said Y-direction guide bars.

12. The dual stage positioning and switching system as claimed in claim 1, characterized in that said supporting structure connects to said base via gas levitation or magnetic levitation.

13. The dual stage positioning and switching system as claimed in claim 1, characterized in that said supporting structure further comprises a linear motor, a gas levitation bearing, a pair of circuit contacts, a fastener, and a vacuum pipeline unit; said object stage being connected to said object stage connector via said gas levitation bearing, said circuit contacts, and said fastener.

14. The dual stage positioning and switching system as claimed in claim 13, characterized in that said vacuum pipeline unit comprises a vacuum pipeline and an energy storage device.

15. The dual stage positioning and switching system as claimed in claim 13, characterized in that said gas levitation bearing is selected from the group consisting of vacuum preload gas levitation bearing and permanent magnetic preload gas levitation bearing.

* * * * *